United States Patent
Ho et al.

[11] Patent Number: 6,071,133
[45] Date of Patent: Jun. 6, 2000

[54] ELECTRICAL CARD CONNECTOR WITH MULTI-STROKE EJECTOR MEANS

[75] Inventors: Yu-Ming Ho, Pen-Chiao; Shun-Chi Dong, Tu-Chen, both of Taiwan

[73] Assignee: Hon Hai Precision Ind. Co., Ltd., Taipei Hsien, Taiwan

[21] Appl. No.: 09/036,989

[22] Filed: Mar. 9, 1998

[30] Foreign Application Priority Data

| Mar. 8, 1997 | [TW] | Taiwan | 86203693 |
| Mar. 11, 1997 | [TW] | Taiwan | 86203692 |
| Mar. 13, 1997 | [TW] | Taiwan | 86204064 |
| Mar. 14, 1997 | [TW] | Taiwan | 86204066 |

[51] Int. Cl.$^7$ ............................................... H01R 13/62
[52] U.S. Cl. ............................................... 439/159
[58] Field of Search ................................ 439/159, 160; 361/725, 727, 737, 754, 683, 684, 686

[56] References Cited

U.S. PATENT DOCUMENTS

| 5,383,789 | 1/1995 | Watanabe | 439/159 |
| 5,421,737 | 6/1995 | Chen et al. | 439/157 |
| 5,466,166 | 11/1995 | Law et al. | 439/159 |
| 5,713,750 | 2/1998 | Ho | 439/159 |

*Primary Examiner*—Steven L. Stephan
*Assistant Examiner*—Barry M. L. Standig

[57] ABSTRACT

An electrical card connector for electrically connecting an exterior electrical card to a circuit board, comprises an insulative housing body and a multi-stroke ejector means wherein the housing body includes a mating surface electrically connected with the electrical apparatus, and the ejector means includes an actuator for providing a manual operation, a lever having an operating end for joining with the actuator and an opposed acting end for pushing the inserted electrical apparatus, and a pair of symmetric supporting surfaces formed above the housing body and defining a shortest distance therebetween to be a linear contour which is parallel to the mating surface of the connector, so that the lever can respectively abut against and pivot upon the pair of symmetry supporting surfaces in the same radians to provide different force arms for satisfying the requirement of different forces for accurately drawing the electrical card from the connection with the contacts of the connector or completely ejecting the electrical card out.

13 Claims, 15 Drawing Sheets

6,071,133

ELECTRICAL CARD CONNECTOR WITH MULTI-STROKE EJECTOR MEANS

BACKGROUND OF THE INVENTION

1. Field of The Invention

The present invention relates to an electrical card connector for electrically connecting an exterior electrical apparatus to a circuit board, and particularly to an electrical card connector with a multi-stroke ejector means for providing users with a labor-saving function.

2. The Prior Art

As shown in FIG. 1, a prior art electrical card connector 5 includes a housing body 50, a combining means 51 and a mechanical ejector 52 therein wherein the ejector 52 further consists of a pair of opposed guiding bars 521, a metallic pushing plate 522, a lever 523 and an actuator 524. When all of the parts are assembled with each other, the metallic pushing plate 522 is parallel to a horizontal axis of the housing body 50, and the combining means 51 and the lever 523 are successively positioned above the pushing plate 522 in a stacked relationship, and the pair of opposed guiding bars 521 are respectively deposited in opposed and spaced ends of the housing body 50 and one of the bars 521 is further laterally deposited with the actuator 524. In detail, a groove 5231 of the lever 523 is rotatablely attached to a protrusion 5221 bent on the pushing plate 522 to permit that the lever 523 can pivot upon the protrusion 5221 of the pushing plate 522 in a specific angle. A bore 5232 defined on the lever 523 is rotatablely attached to a downward flange 5101 protruded on the combining means 51. A free end of the lever 523 exposed to the outside of housing body 50 (shown in FIG. 2) is further clamped by a fork portion 5241 formed in an end of the actuator 524 of which opposite end forms an operation button 5242. When said operation button 5242 of the actuator 524 is manually pushed by a user, the whole actuator 524 is horizontally moved along one lateral side of the corresponding guiding bar 521 to actuate said free end of the lever 523. Simultaneously, the lever 523 pivots upon the flange 5101 of the combining means 51 which functions as a fulcrum, so that the groove 5231 thereof accompanying the protrusion 5221 of the plate 522 can actuate the whole pushing bar 522 to slide outwardly thereby ejecting an electrical card out which has been inserted into the electrical card connector.

However, prior art electrical card connectors may encounter an undesired problem in a manual operation that a larger operating force for completely ejecting the inserted electrical card out is usually required in an instant, because of an overly short operating force arm F formed between the free end and the bore 5232 of the lever 523 as shown in FIG. 2, even the operating force arm F is longer than an acting force arm R formed between the bore 5232 and the groove 5231 of the lever 523.

The other type of prior art electrical card connectors for resolving the foregoing problem have proposed a labor-saving ejector mechanism, as disclosed in U.S. Pat. Nos. 5,383,789 and 5,421,737, which consists of a curved lever and a pair of curved contact surfaces formed on the housing body in response to the lever. However, some abrupt changes in the curved contours of either the lever or the contact surfaces cause that the structure thereof are too complicated and not easily formed thereby requiring a higher manufacturing cost. In addition, because the designs of the curved contours thereof are asymmetrical and offset from each other, it causes that when the lever respectively pivots upon the contact surfaces in different radians, the ejecting steps such as drawing the electrical card drawn from the connection with the contacts of the connector or completely ejecting the electrical card out may be not completely executed. And, due to the curved contours of both of the lever and the corresponding contact surfaces being asymmetrical with each other, a "die point" in the structures may exist to delay the ejecting time of the electrical card in the operation process thereof.

Accordingly, to resolve the above problems, an object of the present invention is to provide an electrical card connector of which multi-stroke ejector means includes a lever and a pair of supporting surfaces symmetrically formed on a housing body of the connector for providing the lever with a variable fulcrum to constitute different force arms for satisfying the requirements of different acting forces in the ejecting process of the electrical card.

Another object of the present invention is to provide an electrical card connector which has a simplified multi-stroke ejector means for lowering the manufacturing cost thereof.

Another object of the present invention is to provide an electrical card connector of which one of the pair of symmetric and supporting surfaces cooperating with the lever can offer a longer force arm than the width half of the housing body for providing a labor-saving function in an instant when the electrical card is drawn from the connection with a plurality of contacts of the connector.

Another object of the present invention is to provide an electrical card connector of which a shortest distance formed between the pair of symmetrical supporting surfaces as being a linear contour which is parallel to a mating surface of the connector for providing the lever respectively pivoting upon the symmetrical supporting surfaces with the same radians to ensure either the electrical card being really drawn from the connection with the contacts of the connector or the electrical card being completely ejected out.

SUMMARY OF THE INVENTION

According to an aspect of the present invention, an electrical card connector for electrically connecting an exterior electrical card to a circuit board, comprises an insulative housing body, a connecting plate, a pair of guiding bars and a multi-stroke ejector means. The housing body further includes a mating surface electrically connected with the electrical apparatus. The ejector means includes an actuator for providing a manual operation, a lever having an operating end for joining with the actuator and an opposed acting end for pushing the inserted electrical apparatus, and a pair of supporting surfaces symmetrically form on the housing body and defining a shortest distance therebetween as being a linear contour parallel to the mating surface of the connector. When the actuator is manually pressed, the lever can respectively abut against and pivot upon the pair of symmetrical supporting surfaces as a variable fulcrum to provide different force arms to satisfy the requirement of different forces for accurately drawing the electrical apparatus from the connection with the contacts of the connector or completely ejecting the electrical apparatus out in a labor-saving condition.

DETAILED DESCRIPTION OF THE PREFERRED EMBODIMENT

Figure 1:
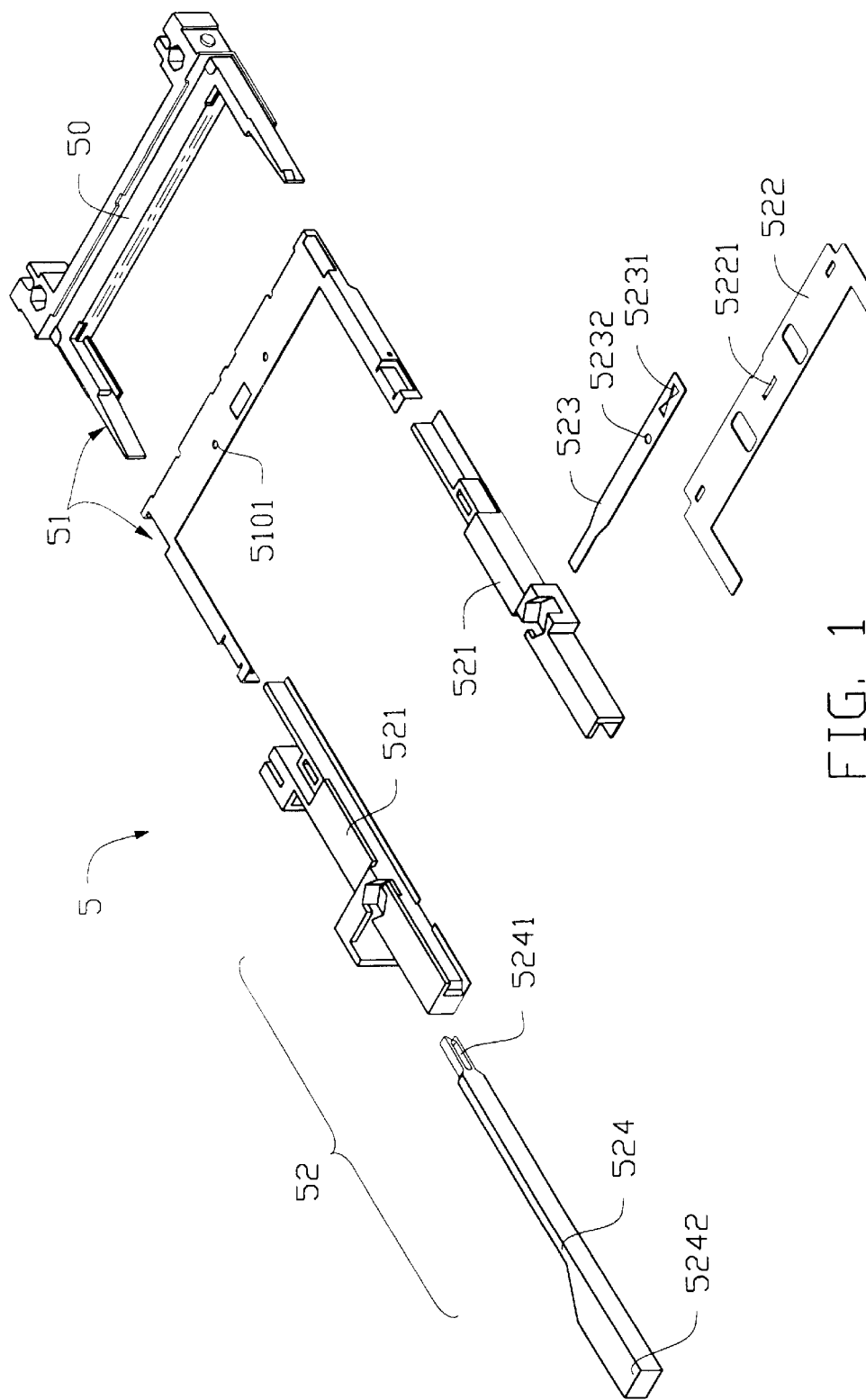
FIG. 1 is an exploded view of a prior art electrical card connector.
Figure 2:
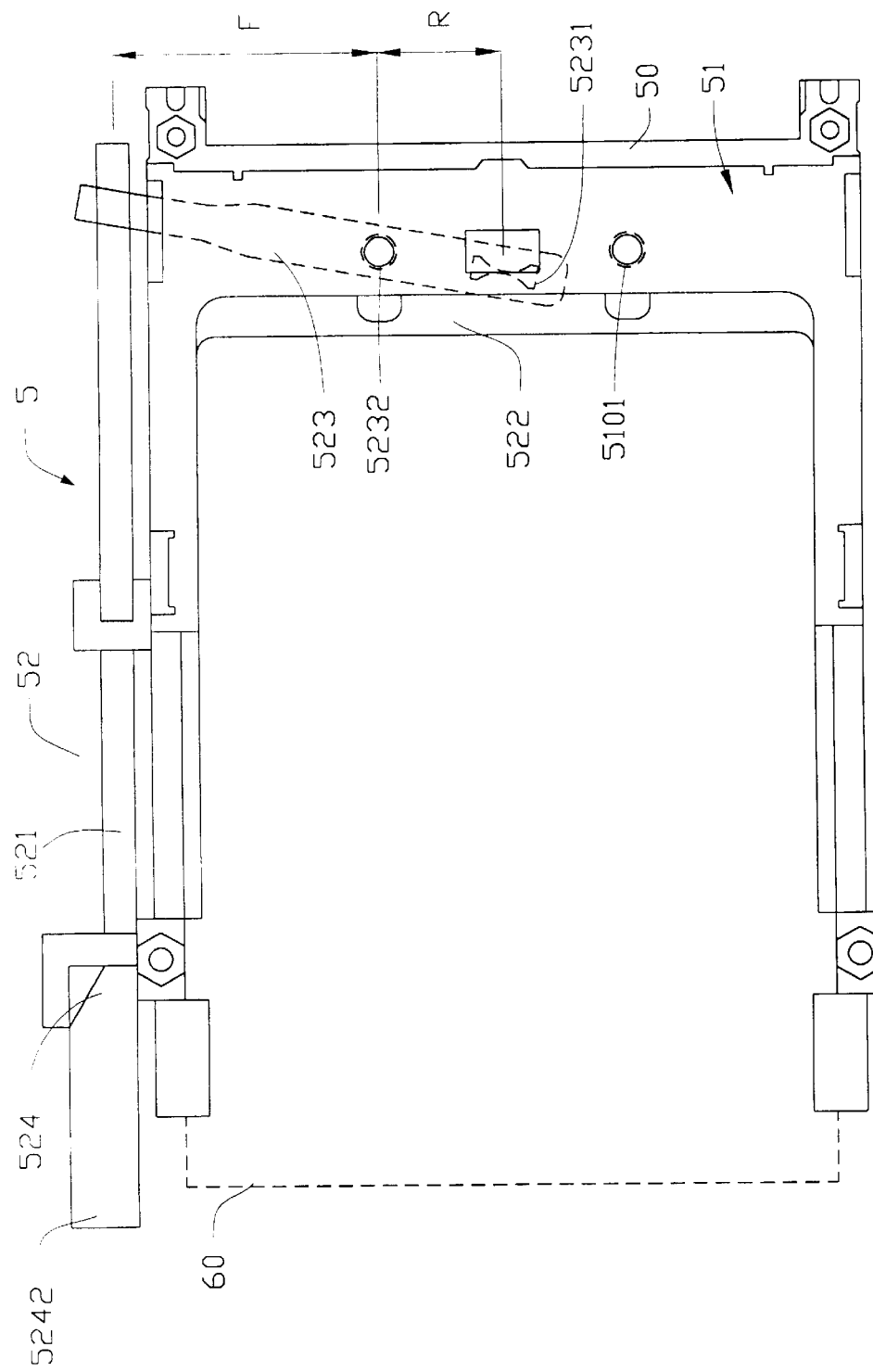
FIG. 2 is a top view of the prior art electrical card connector as shown in FIG. 1.

References will now be made in detail with regard to the preferred embodiments of the present invention. An electrical card connector 1 of a first embodiment in accordance with the present invention shown in FIG. 3 for electrically connecting an exterior electrical card (not shown) or the like to a circuit board (not shown), includes a housing body 10, a metallic connecting plate 121, a pair of guiding bars 122, an ejector means 100.

The insulative housing body 10 further includes a mating surface 140 receiving a plurality of contacts 101 therein, a curved supporting means 125 positioned perpendicular to the mating surface 140 and a pair of spaced and opposite extension arms 110 respectively formed adjacent to opposed ends (not labeled) of the mating surface 140 wherein the mating surface 140 and the pair of extension arms 110 define a receiving space (not labeled) for receiving the exterior electrical card therein to electrically connect the contacts 101 in mating surface 140 and the electrical card. The curved supporting means 125 has a pair of supporting curved surfaces 1251 symmetrically extended toward said receiving space and adjacent to each other as being a continuous symmetroid. A notch 1256 is defined between the mating surface 140 and the supporting means 125 and adjacent to one of extension arms 110. A protrusion 111 extended outwardly is formed on a free end of each of the extension arms 110.

The metallic connecting plate 121 consists of an intermediate 1210 and a pair of spaced fixed arms 1213 (not labeled) respectively located on opposed ends of the intermediate 1210. The intermediate further includes an pair of spaced elongated oblique slots 1212 defined thereon, a L-shaped restriction means 1211 stamped and bended between the pair of spaced elongated slots 1212, and a window 1216 defined adjacent to one of the fixed arms 1213. Each fixed arm includes a hole 1214 and a locking portion 1215 adjacent to a free end thereof.

The pair of guiding bars 122 each include a top recess 1225, a groove 1223 facing said receiving space for guiding the insertion of the electrical card, and a metallic grounding clip 1224 fixedly attached to the groove 1223 for providing the inserted electrical card with a grounding function. One of the guiding bars 122 forms a holder 1226 with a through cave (not shown) on a lateral side thereof for receiving an elongated actuator 124 which consists of a pushing button 1242 formed on a free end thereof and a fold portion 1241 with a slot formed on an opposite end thereof.

The ejector means 100 mainly consists of a lever 123, the actuator 124 and the supporting means 125 of the housing body wherein the lever 123 further includes an operating end 1232 formed on a free end thereof and an opposed acting end 1231 perpendicularly bent downward from a surface of the lever 123 and functioning as a pushing plate for ejecting an inserted electrical card out. A pair of spaced flanges 1233 are downward protruded from the surface of the lever 123 in response to the elongated slots 1212 of the connecting plate 121.

Figure 3:
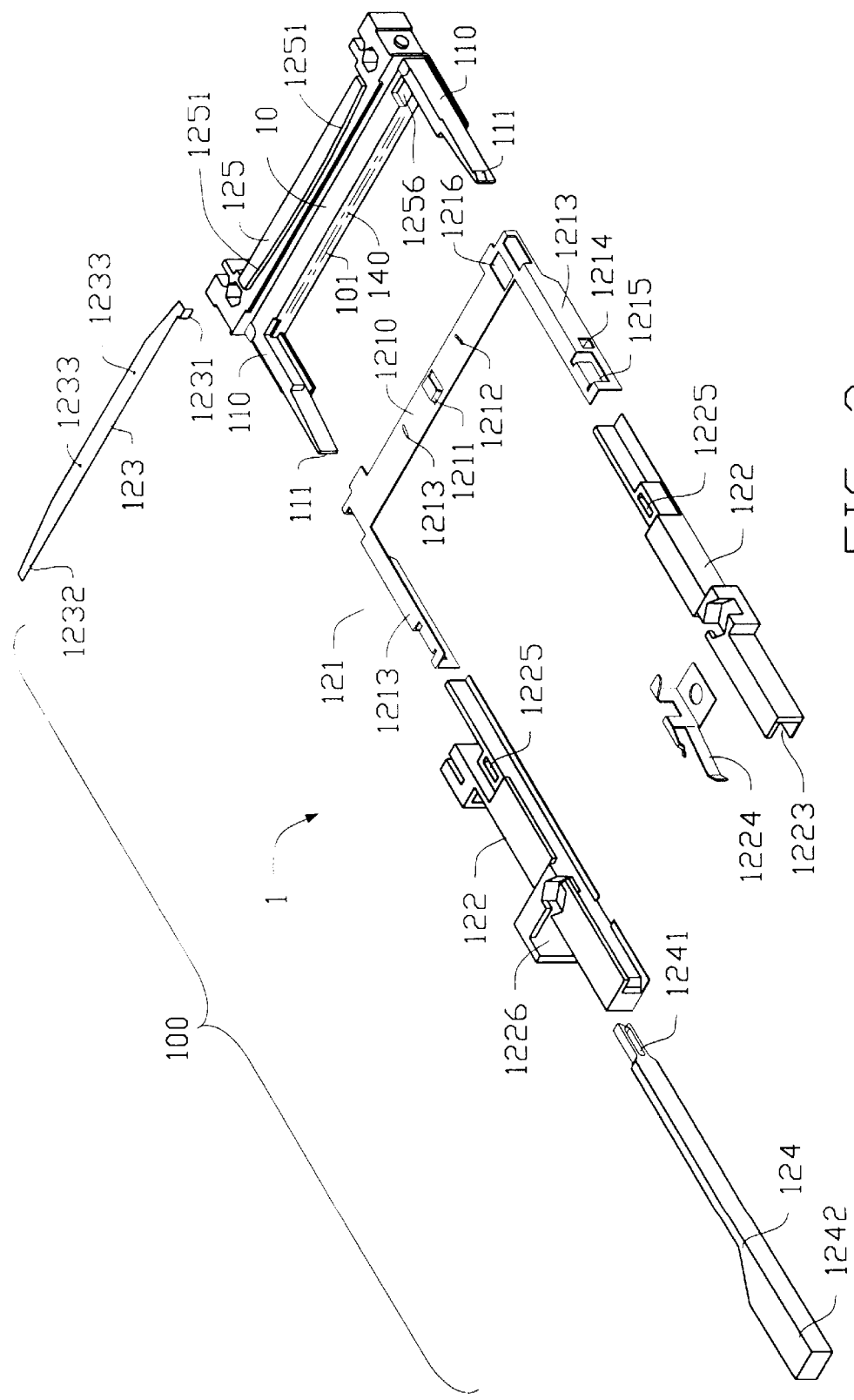
FIG. 3 is an exploded view of an electrical card connector of a first embodiment in accordance with the present invention.
Figure 4A:
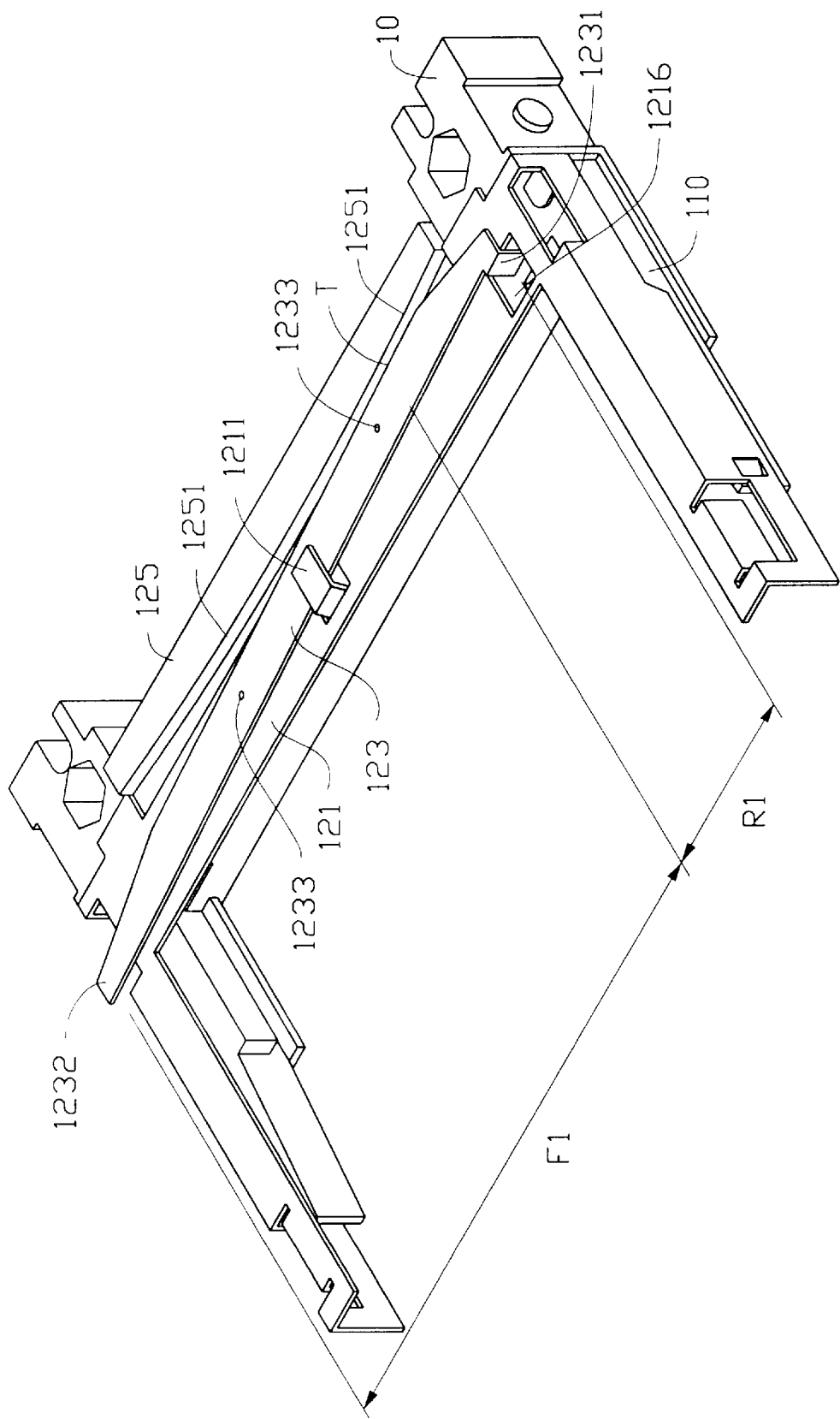
FIGS. 4A–4C are successively active views of the electrical card connector as shown in FIG. 3 after partially assembled.

In assembly as shown in FIGS. 3 & 4A, a middle portion of the lever 123 is grasped by the L-shaped restriction means 1211 of the connecting plate 121, and the acting end 1231 of the lever 123 extends through the window 1216 of the connecting plate 121 and is movably received in the notch 1256 of the housing body 10. To form a rotatable joint, the operating end 1232 of the lever 123 is clamped within the slot of the fold portion 1241 of the actuator 124 attached to the holder 1226 of one of the guiding bars 122. Then, the protrusions 111 of the housing body 10 are locked with the holes 1214 of the connecting plate 121 adjacent to the locking portions 1215 which are respectively retentively embedded within the recesses 1225 of the pair of guiding bars 122 whereby most of the parts are generally assembled with each other.

It is noted that after assembled as shown in FIG. 4A, the whole lever 123 is almost restricted between the restriction means 1211 and the curved supporting means 125 except that the operating end 1232 thereof is exposed to the outside for joint with the actuator 124. In addition, the window 1216 of the connecting plate 121 is positioned above the notch 1256 of the housing body 10 in alignment so as to further extend the acting end 1231 of the lever 123 within the notch 1256 via the window 1216, and the flanges 1233 of the lever 123 respectively cooperate with the elongated slots 1212 of the connecting plate 121 so as to restrict the lever rotatablely moving in a specific distance.

When an electrical card (not shown) is completely inserted into the receiving space of the electrical card connector 1, a front edge of the electrical card press and move the acting end 1231 of the lever 123 to a bottom side of the window 1216 of the connecting plate 121 as shown in FIG. 4A, so that a portion of the lever 123 can abut against one of the supporting surfaces 1251 of the supporting means 125.

Figure 4B:
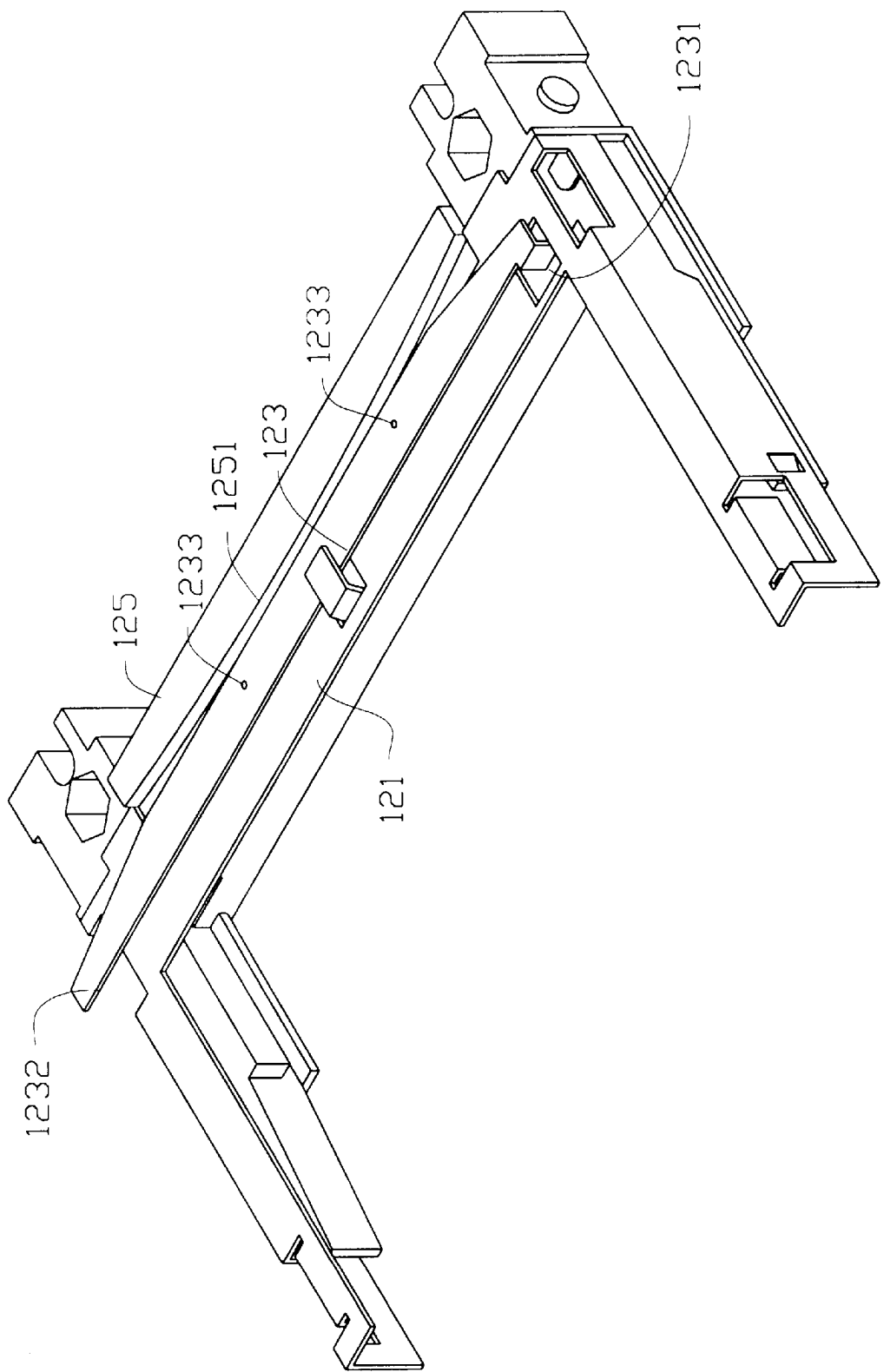
Figure 4C:
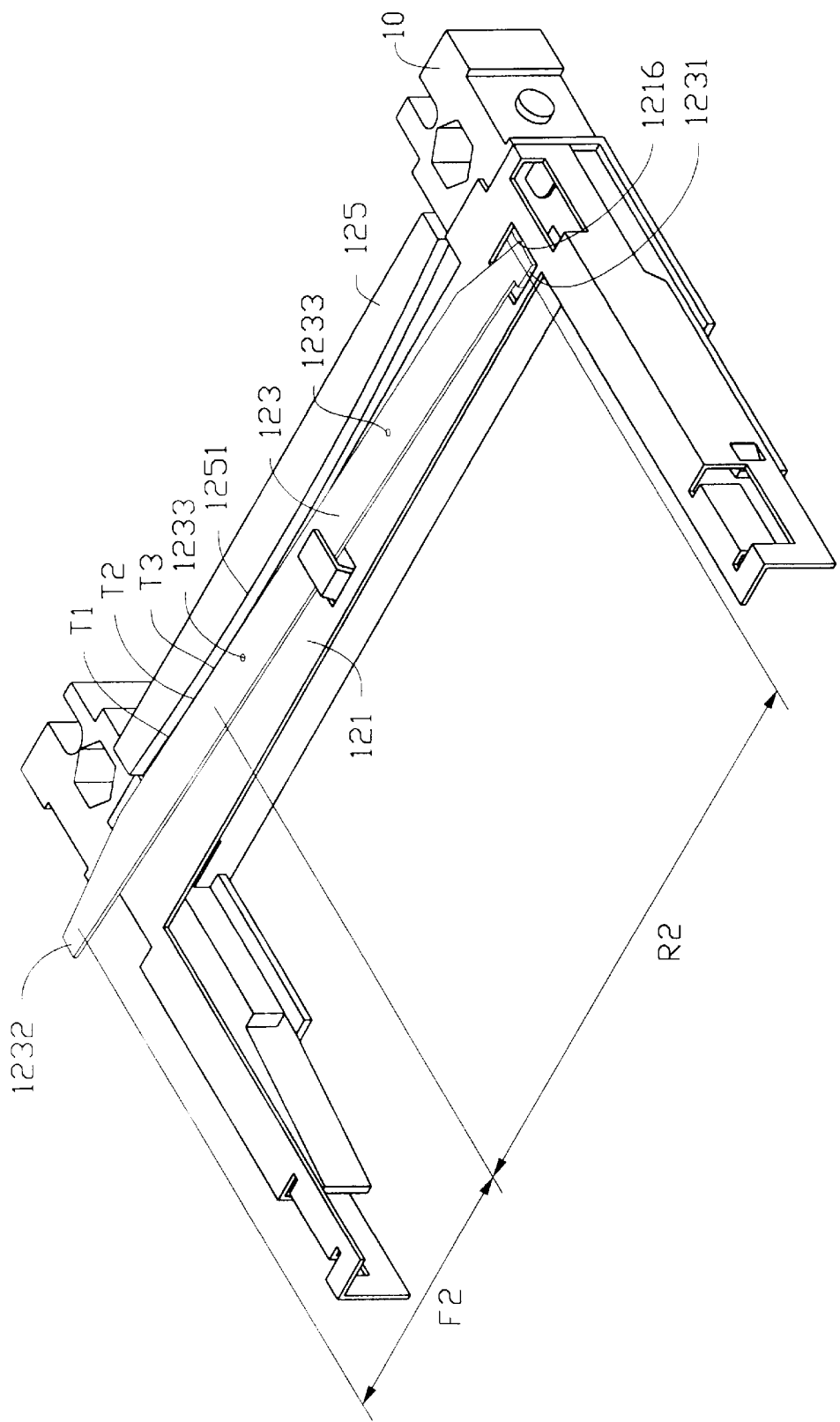

In operation, the pushing button 1242 of the actuator 124 is manually pressed to force the whole actuator 124 accompanying with the operating end 1232 of the lever 123 to horizontally move along a lateral side of one of guiding bars 122, so that the lever 123 can pivot upon a point T on the corresponding supporting surface 1251 of the housing body 10 in an operating force arm F1 which is longer than the half of the distance defined between the extension arms 110 and is longer than an acting force arm R1 from the point T to the acting end 1231 of the lever 123 whereby the acting end 1231 abutting against a front edge of the inserted electrical card can draw the inserted electrical card from the connection with the contacts 101 of the electrical card connector 1 in a larger force. Furthermore, while the manual operation is continued, the lever 123 can pivot and slide along the outer contour of the curved supporting means 125 from one of the pair of supporting surfaces 1251, via a tip portion (not labeled) as shown in FIG. 4B, to another one of the pair of supporting surfaces 1251 as shown in FIG. 4C. Therefore, it is known that the lever 123 can successively move along the curved contours of the pair of symmetrical supporting surfaces 1251.

As shown in FIG. 4C, when the lever 123 reaches another one of the pair of supporting surface 1251 through some fulcrums T1, T2 & T3, the manual operation still saves labor because the inserted electrical card has been completely drawn from the connection with the contacts 101 of the connector 1 and does not require a large force to be further ejected outside the receiving space of the connector 1, even although an operating force arm F2 is gradually less than an acting arm R2. Both of the symmetrical support surfaces 1251 can provide the lever 123 with the same radians thereby ensuring that the electrical card is completely ejected out.

Figure 5A:
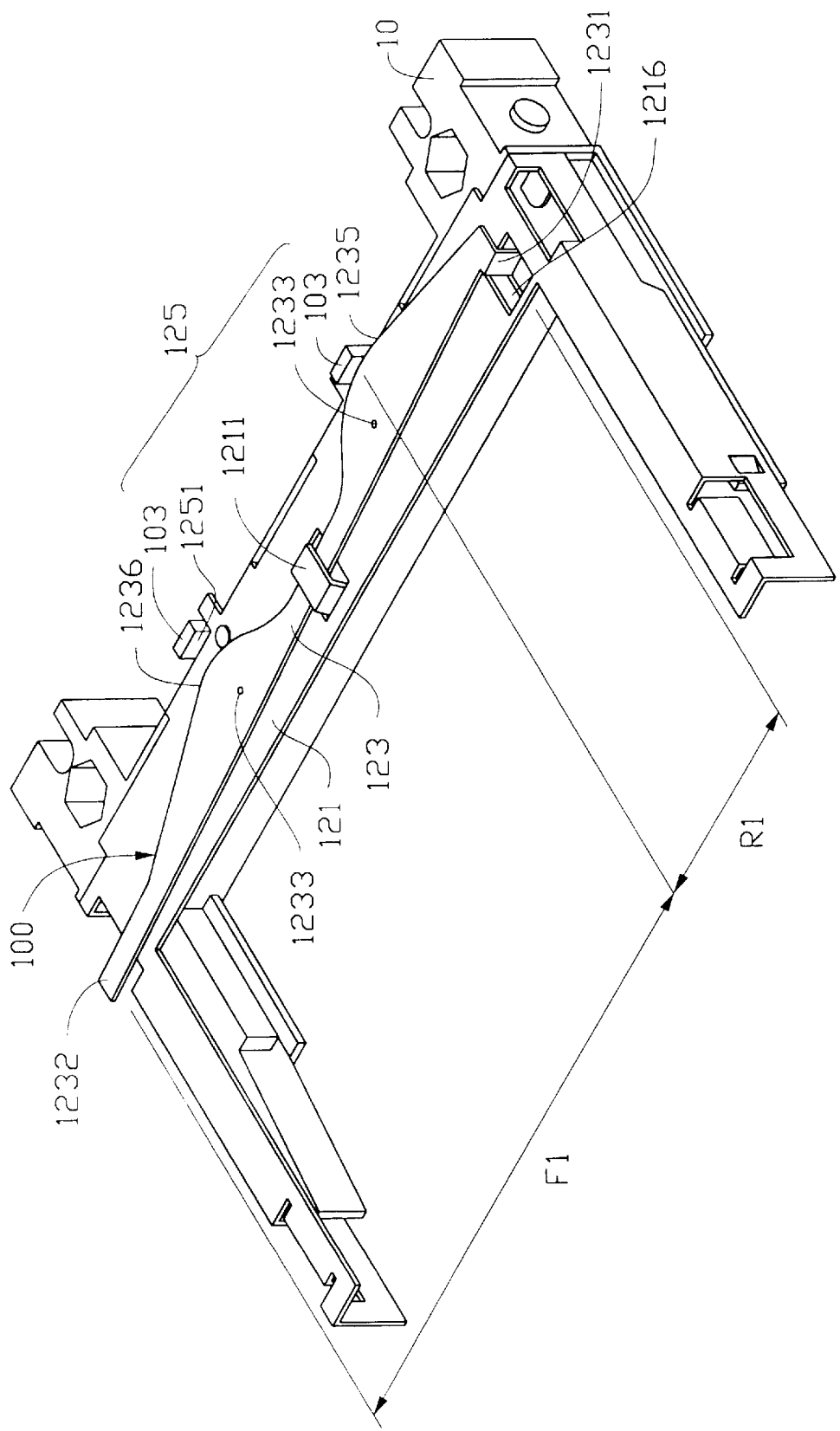
FIGS. 5A–5C are successively active views of an electrical card connector of a second embodiment in accordance with the present invention.
Figure 5B:
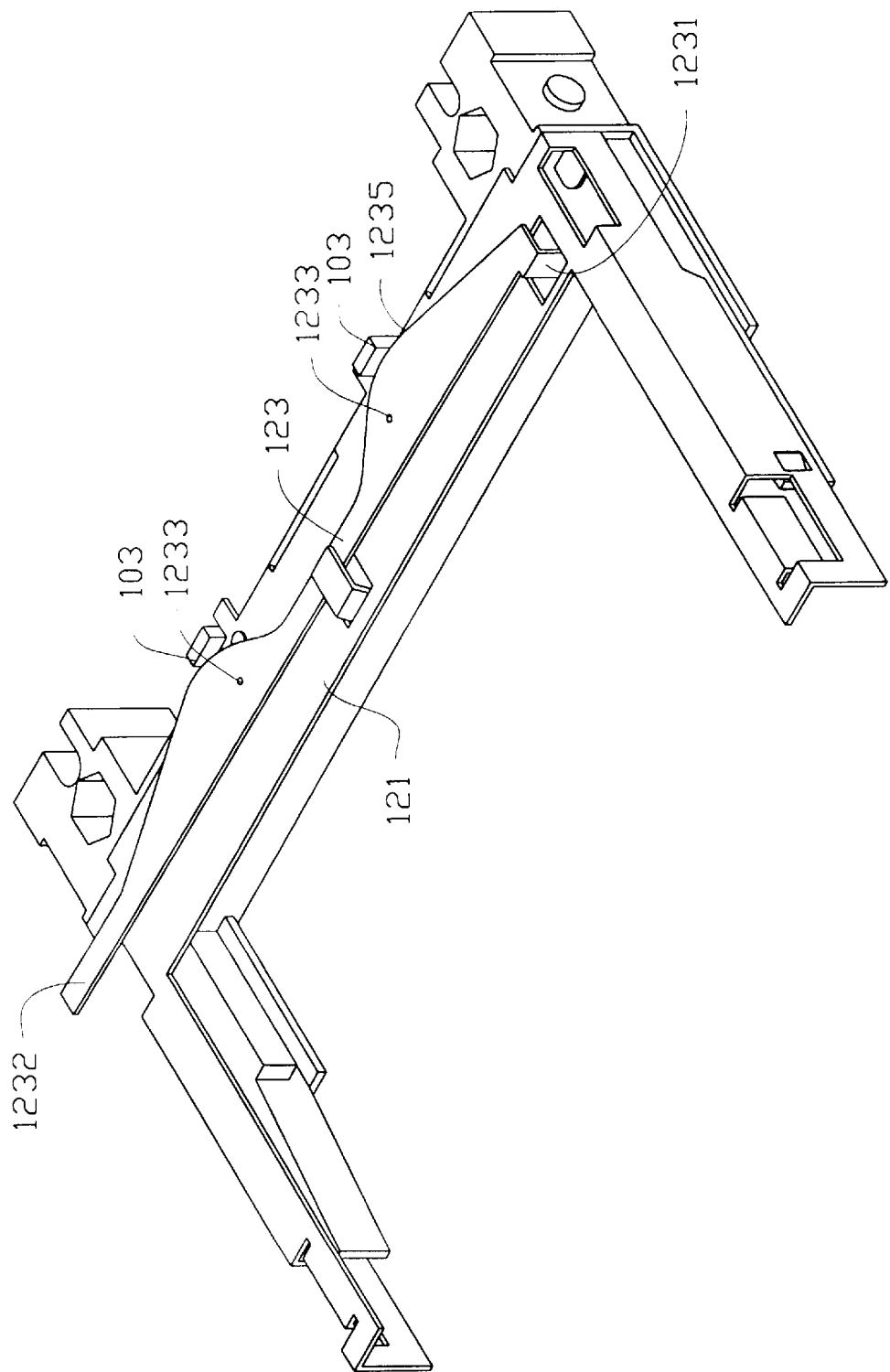
Figure 5C:
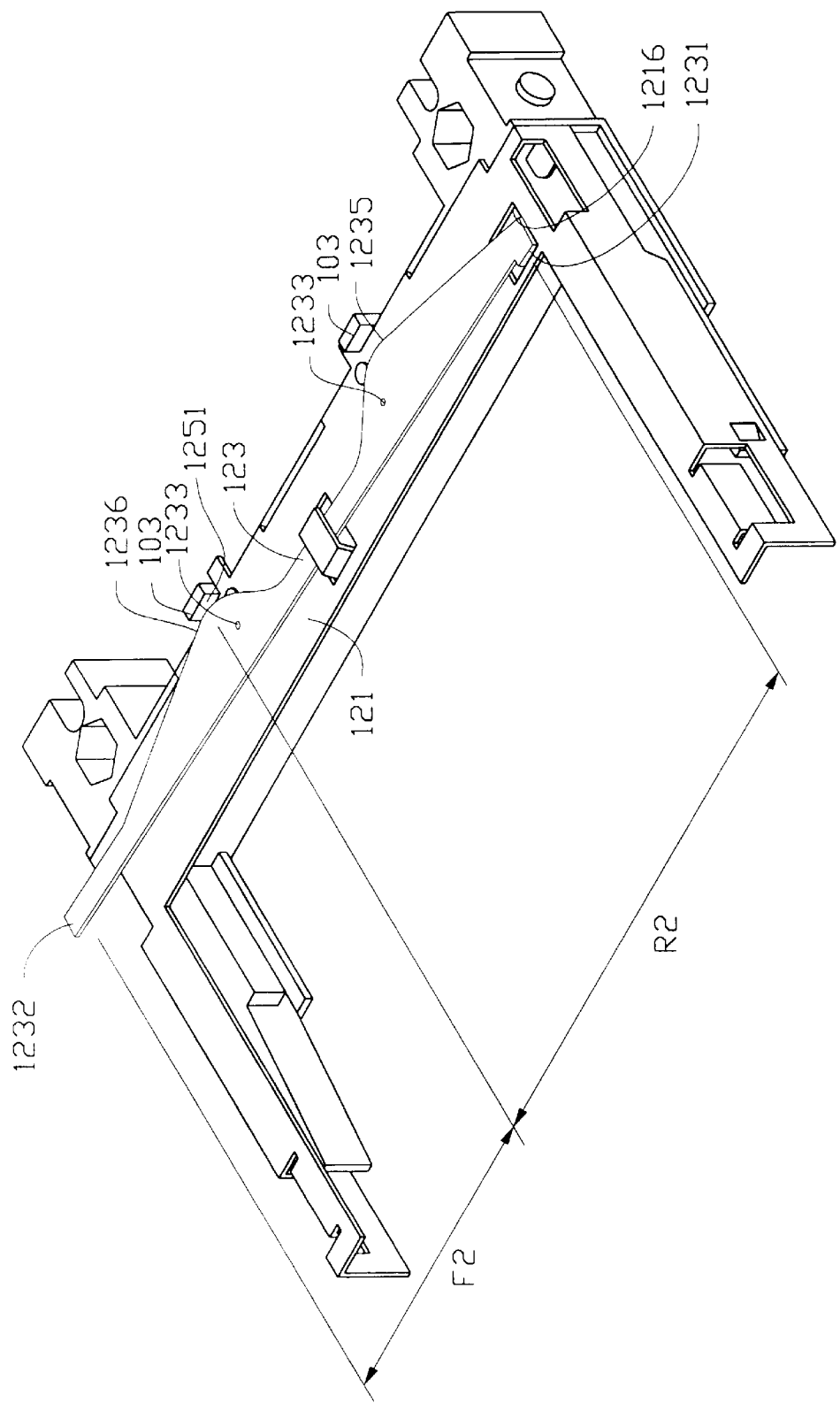

A second embodiment in accordance with the present invention as shown in FIGS. 5A–5C, discloses another design of the ejector means 100 including a supporting means 125 and a lever 123 wherein the supporting means 125 is defined by two separate and symmetrical blocks 103 each which form a supporting surface 1251 thereon, and the lever 123 further includes a pair of convexes 1235, 1236 respectively located adjacent to opposite sides of the restriction means 1211 of the connecting plate 121 in response to said supporting surface 1251 of the supporting means 125. It is noted that the other structures of the second embodiment are similar to the first embodiment of the present invention as shown in FIGS. 4A–4B except the lever 123 and the blocks 103. In the initial operation as shown in FIG. 5A, when the operating end 1232 of the lever 123 is actuated to rotatablely move the whole lever 123, one of the convexes 1235, 1236 of the lever 123 adjacent to the acting end 1231 can pivot upon the supporting surface 1251 of one of the blocks 103 in an operating force arm F1, which is longer than an acting force arm R1 from the convex 1235 to the acting end 1231 and is longer than the width half of the housing body 10 for providing a larger force, to have the acting end 1231 of the lever 123 to completely draw the inserted electrical card (not shown) from the connection with the contacts (not shown) of the connector 1. When the lever 123 is successively rotated until another convex 1236 thereof contacts with the supporting surface 1251 of another block 103 as shown in FIGS. 5B–5C, the operating force arm F2 is gradually less than the acting force arm R2 for successively ejecting the electrical card out.

Figure 6A:
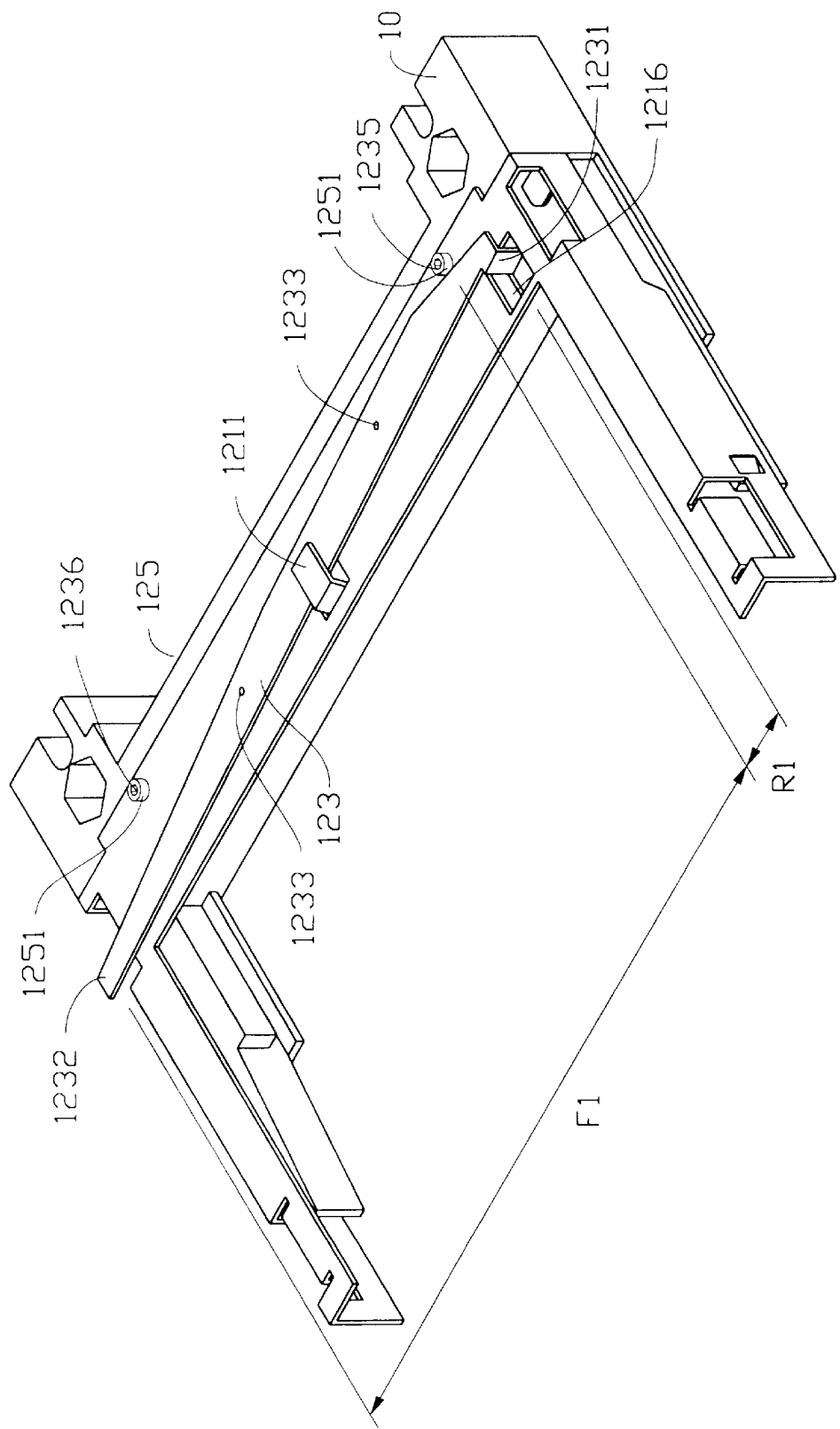
FIGS. 6A–6C are successively active views of an electrical card connector of a third embodiment in accordance with the present invention.
Figure 6B:
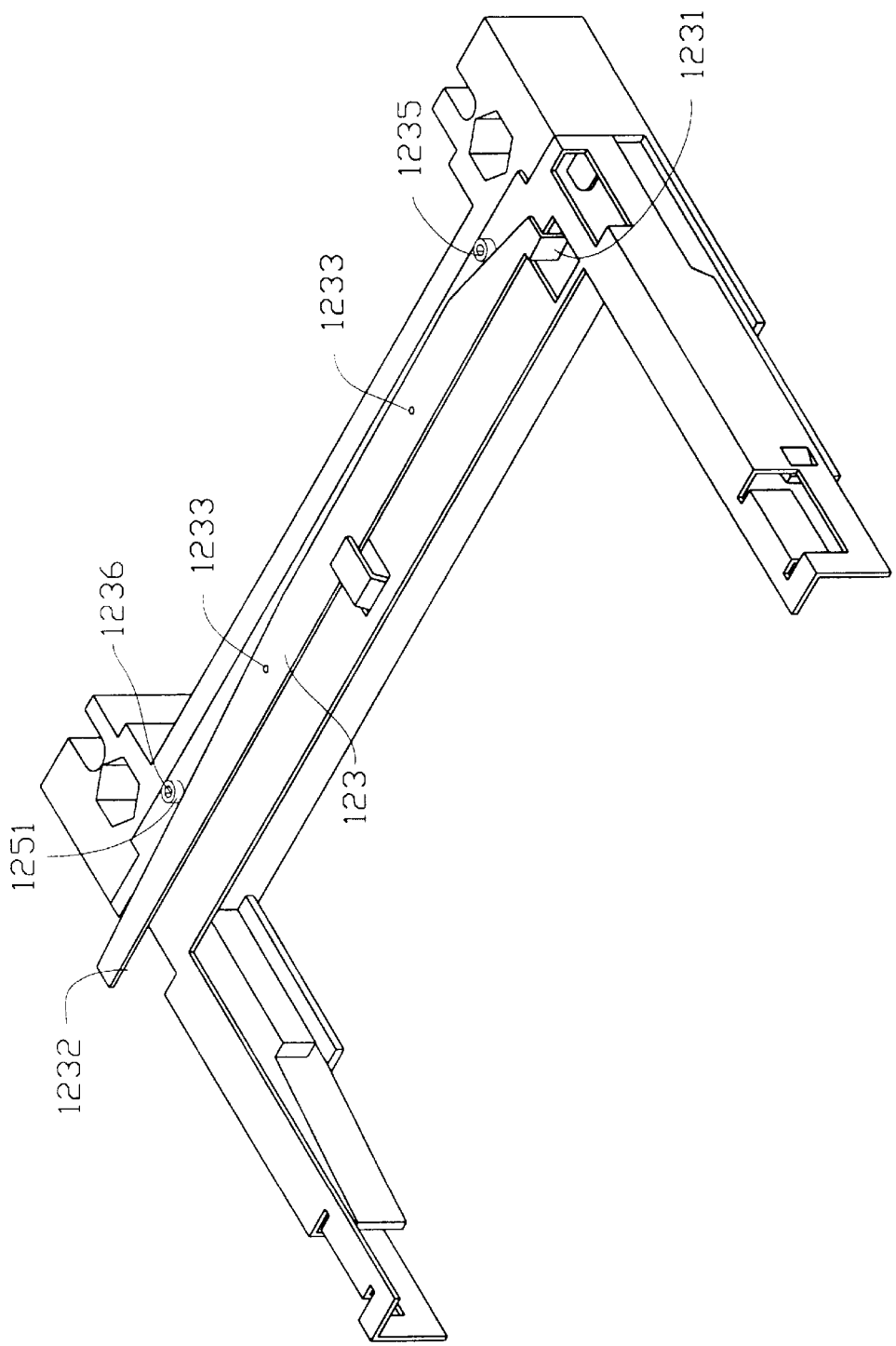
Figure 6C:
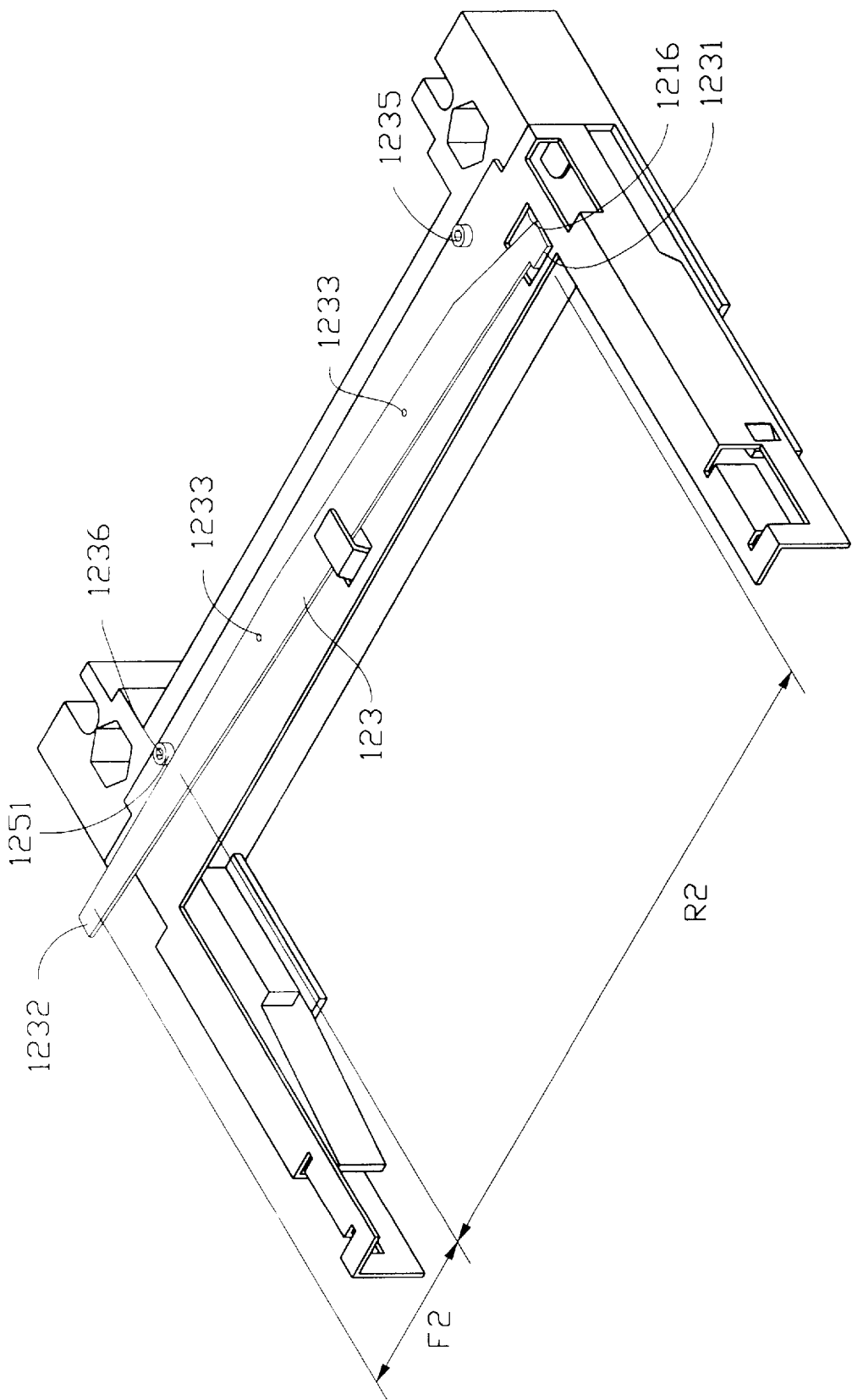

A third embodiment of the present invention as shown in FIGS. 6A–6C, has an ejector means 100 including a supporting means 125 and a lever 123 wherein the supporting means 125 is defined by two separate and symmetrical posts 1235, 1236 each which form a supporting surface 1251 thereon. It is noted that the other structures of the third embodiment are generally similar to the first embodiment of the present invention as shown in FIGS. 4A–4B except the posts 1235, 1236. In the initial operation as shown in FIG. 6A, when the operating end 1232 of the lever 123 is actuated to rotatablely move the whole lever 123, one portion of the lever 123 adjacent to the acting end 1231 can pivot upon the supporting surface 1251 of one of the posts 1235 in an operating force arm F1, which is longer than an acting force arm R1 from the post 1235 to the acting end 1231 and is longer than the width half of the housing body 10 for providing a larger force, to have the acting end 1231 of the lever 123 to completely draw the inserted electrical card (not shown) from the connection with the contacts (not shown) of the connector 1. When the lever 123 is successively rotated until another portion thereof contacts with the supporting surface 1251 of another post 1236 as shown in FIGS. 6B–6C, the operating force arm F2 is gradually less than the acting force arm R2 for successively ejecting the electrical card out.

Figure 7A:
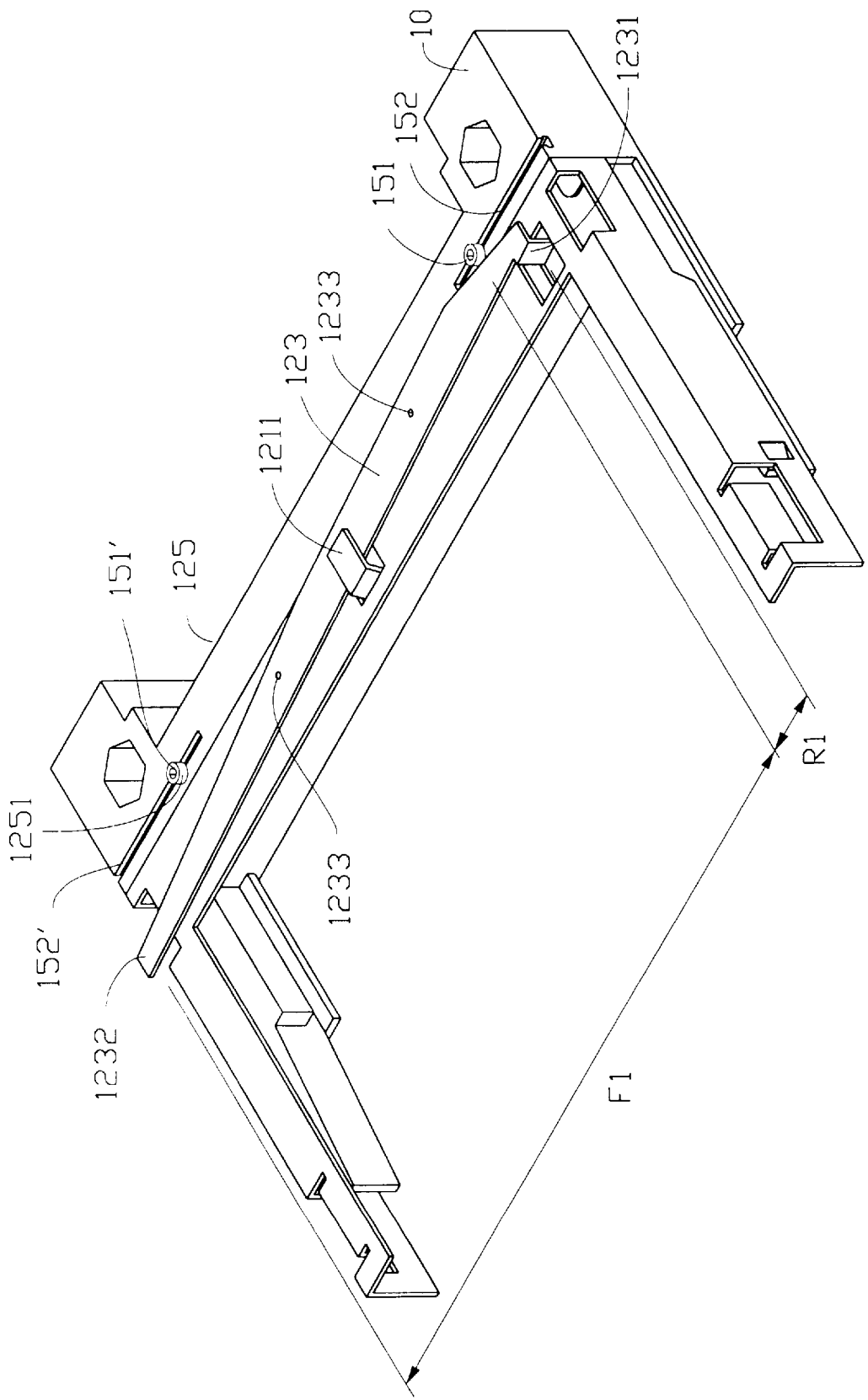
FIGS. 7A–7C are successively active views of an electrical card connector of a fourth embodiment in accordance with the present invention.
Figure 7B:
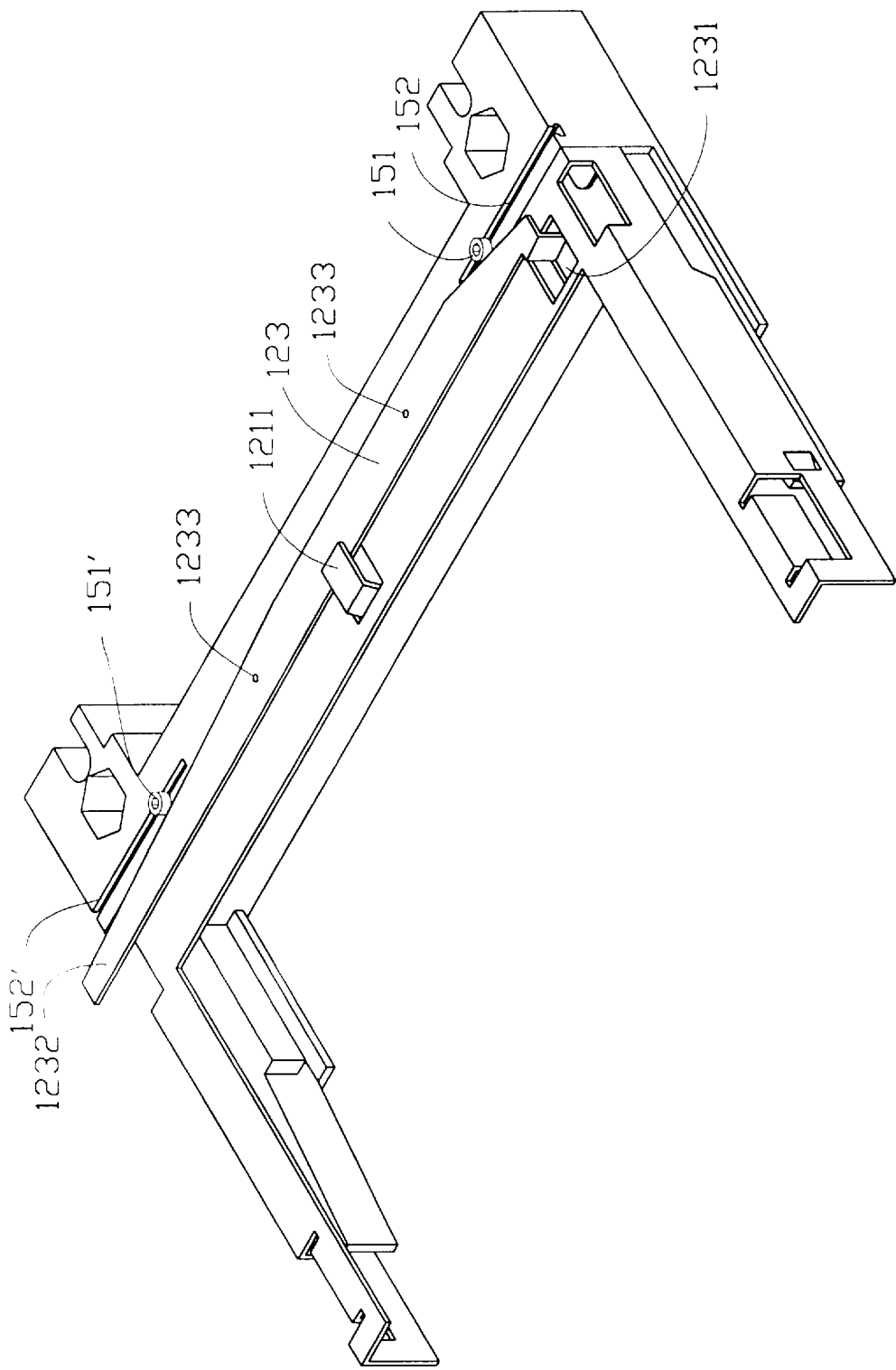
Figure 7C:
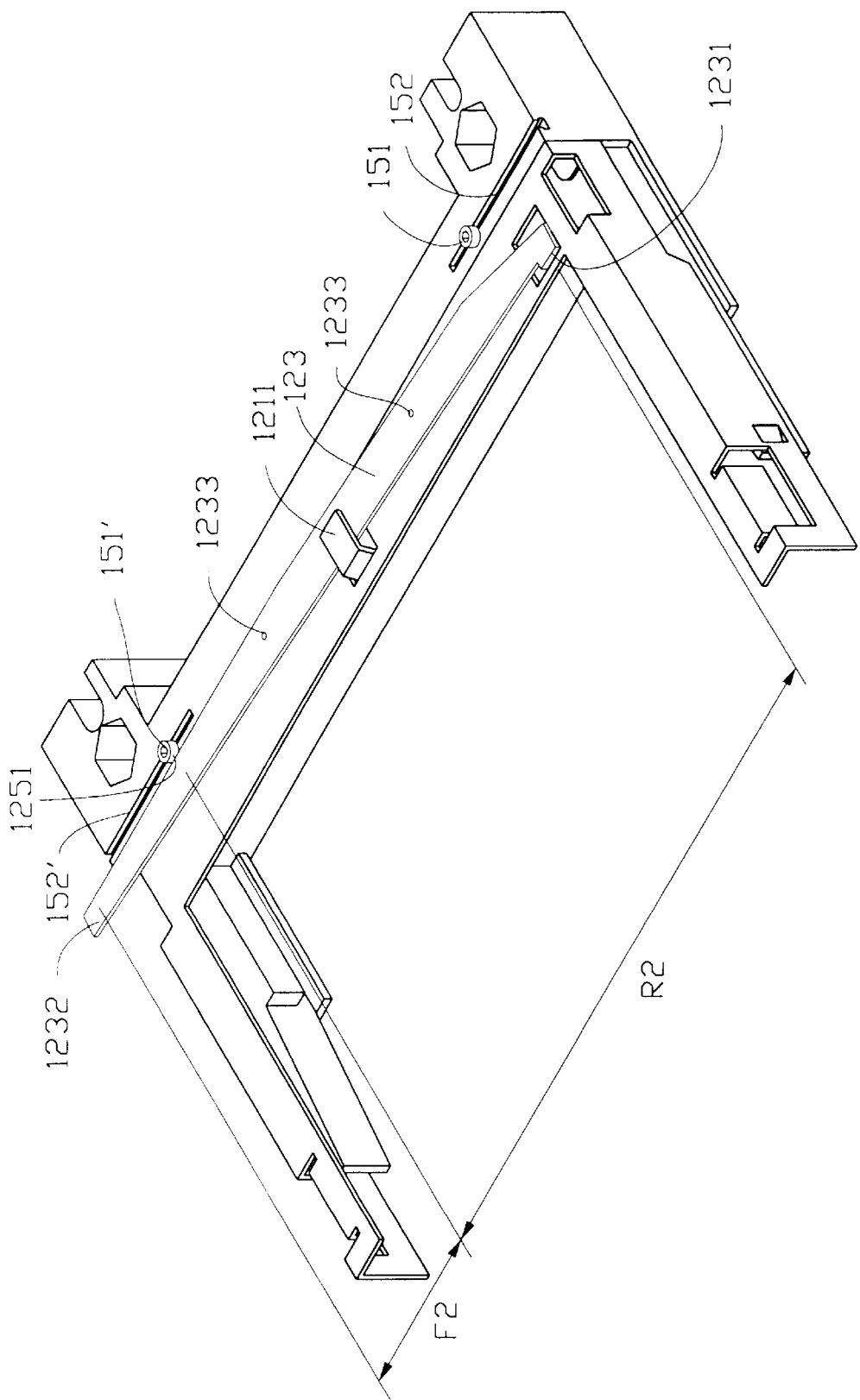

A fourth embodiment of the present invention as shown in FIGS. 7A–7C, is generally similar to the third embodiment shown in FIGS. 6A–6C except the posts 151, 151' thereof each which are fixedly attached to a corresponding groove 152 formed on the housing body 10, rather than is integral with the housing body 10 as the third embodiment.

Based on the aforementioned, it is understood that by means of cooperation between the lever 123 and the symmetrical supporting curved surfaces 1251 of the housing body 10, the lever 123 can respectively pivot upon the symmetric supporting surfaces 1251 which function as a continuously variable (i.e., more than two) fulcrums to define different force arms for satisfying the requirements of different acting forces in the ejecting process of the electrical card. In addition, due to the symmetric design of the supporting surfaces and a shortest distance (not labeled) formed between the symmetric supporting surfaces 1251 which functions as a linear contour parallel to a mating surface 140 of the connector as shown in FIG. 3, the lever 123 can respectively pivot upon the symmetric supporting surfaces 1251 in the same radians to ensure either the electrical card being really drawn from the connection with the contacts of the connector 1 or the electrical card being completely ejected out. It is found that through FIGS. 4A, 5A, 6A & 7A, either a lateral side of the lever 123 abutting against the symmetric supporting surfaces 1251, or a shortest distance defined between the pair of symmetric supporting surfaces 1251 and parallel to the mating surface 140 of the housing body 10 is exclusively designed to be a linear contour thereby avoiding delaying the ejecting time of the electrical card. Therefore, the multi-stroke ejector means 100 of the present invention can provide a simplified structure to lower the manufacturing cost thereof and a labor-saving function.

While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. An electrical connector for electrically connecting an exterior electrical apparatus to a circuit board, comprising:

an insulative housing body including a mating surface for electrical connection with the electrical apparatus;

an ejector means including an actuator for providing a manual operation, a lever having an operating end for joining with the actuator and an opposed acting end for abutting against a front edge of the inserted electrical apparatus, and a first and a second supporting surface symmetrically formed on the housing body to pivotally and slidably move the lever there along;

a pair of guiding bars each having a groove for guiding the insertion of the electrical apparatus wherein one of the pair of guiding bars is fixedly attached with the actuator; and a connecting plate for fixedly connecting the housing body and the pair of guiding bars; wherein a shortest distance defined between the first and second symmetrical supporting surface functions as a linear contour which is parallel to the mating surface of the connector, so that the lever can respectively abut against and pivot upon the first and second symmetrical supporting surface to draw the electrical apparatus from the connection with the contacts of the connector and to completely eject the electrical apparatus out.

2. The electrical connector as described in claim 1, wherein a notch is defined on the housing body and adjacent to one of a pair of extension arms positioned at opposite ends of the housing body, the acting end of the lever being movably received in the notch.

3. The electrical connector as described in claim 2, wherein a window is defined on the connecting plate and the acting end of the lever extends through the window to be movably received in the notch of the housing body.

4. The electrical connector as described in claim 3, the acting end of the lever is perpendicularly bent downward from a surface of the lever.

5. The electrical connector as described in claim 1, the connecting plate further forms an L-shaped restriction means so as to restrict the lever located between the first and second supporting surface and the restriction means.

6. The electrical connector as described in claim 1, the lever further forms a pair of spaced flanges downwardly protruding from a surface of the lever.

7. The electrical connector as described in claim 6, the connecting plate further forms a pair of elongated slots in response to the pair of flanges of the lever so as to respectively cooperate with the flanges to restrict the lever rotatably moving in a specific distance.

8. The electrical connector as described in claim 1, the first and second symmetrical supporting surface are respectively formed on a pair of spaced blocks of the housing body.

9. The electrical connector as described in claim 1, the first and second symmetrical supporting surface are respectively formed on a pair of spaced posts.

10. The electrical connector as described in claim 9, each post is fixedly attached to a corresponding groove formed on the housing body.

11. An ejector means for use with an electrical connector which includes an insulative housing body having a mating surface for electrical connection with the electrical apparatus, a pair of spaced and opposite extension arms respectively formed adjacent to opposite ends of the mating surface, comprising:

an actuator having a pushing button therein for providing a manual operation;

a lever having an operating end for joining with said actuator and an opposed acting end for pushing the inserted electrical apparatus;

a first and second supporting surface symmetrically formed on the housing body to pivotally and slidably move the lever there along;

wherein either a lateral side of the lever abutting against the first and second symmetrical supporting surface, or a shortest distance defined between the first and second symmetrical supporting surface and parallel to the mating surface of the housing body is exclusively designed to be a linear contour.

12. An arrangement for smooth ejection of a card from a connector comprising:

at least a curved supporting surface provided on a housing of said connector; and a lever including a portion adapted to be continuously and positionably abutting against and moving along said curved supporting surface so as to provide variably positioned fulcrums along said curved supporting surface, an operating arm being defined between an operating end of the lever and said positioned fulcrum and being originally longer than an acting arm defined between an acting end of the lever and said positioned fulcrum, the positioned fulcrum continuously moving along said curved supporting surface from said acting end of the lever toward said operating end of the lever to thereby result in the operating arm being finally shorter than the acting arm, thus resulting in a smoothly continuous variable ejection of the lever with regard to the housing.

13. An electrical connector for electrically connecting an exterior electrical apparatus to a circuit board, comprising:

an insulative housing body including a mating surface for electrical connection with the electrical apparatus;

an ejector means including an actuator for providing a manual operation, a lever having an operating end for joining with the actuator and an opposed acting end for abutting against a front edge of the inserted electrical apparatus, and a first and second supporting surface formed on a pair of spaced posts that are symmetrically and fixedly attached to a pair of grooves formed on the housing body;

a pair of guiding bars each having a groove for guiding the insertion of the electrical apparatus wherein one of the pair of guiding bars is fixedly attached with the actuator; and a connecting plate for fixedly connecting the housing body and the pair of guiding bars; wherein a shortest distance defined between the first and second symmetrical supporting surface functions as a linear contour which is parallel to the mating surface of the connector, so that the lever can respectively abut against and pivot upon the first and second symmetrical supporting surface to draw the electrical apparatus from the connection with the contacts of the connector and to completely eject the electrical apparatus out.

* * * * *